(12) United States Patent
Rieh et al.

(10) Patent No.: US 10,381,980 B2
(45) Date of Patent: Aug. 13, 2019

(54) HIGH FREQUENCY SIGNAL GENERATION APPARATUS

(71) Applicant: KOREA UNIVERSITY RESEARCH AND BUSINESS FOUNDATION, Seoul (KR)

(72) Inventors: Jae Sung Rieh, Seoul (KR); Jong Won Yun, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 202 days.

(21) Appl. No.: 15/506,749

(22) PCT Filed: Dec. 31, 2014

(86) PCT No.: PCT/KR2014/013122
§ 371 (c)(1),
(2) Date: Feb. 27, 2017

(87) PCT Pub. No.: WO2016/032072
PCT Pub. Date: Mar. 3, 2016

(65) Prior Publication Data
US 2017/0257062 A1 Sep. 7, 2017

(30) Foreign Application Priority Data

Aug. 27, 2014 (KR) .................. 10-2014-0112177

(51) Int. Cl.
*H01P 5/12* (2006.01)
*H03B 5/12* (2006.01)

(52) U.S. Cl.
CPC .............. *H03B 5/1212* (2013.01); *H01P 5/12* (2013.01); *H03B 5/1218* (2013.01);
(Continued)

(58) Field of Classification Search
CPC .... H03B 2200/0076; H03B 2200/0084; H03B 2200/0098; H03B 5/1218; H01P 5/12
See application file for complete search history.

(56) References Cited

U.S. PATENT DOCUMENTS

| 5,138,284 A * | 8/1992 | Yabuki | ................. H03B 5/1847 331/100 |
| 7,061,336 B2 * | 6/2006 | Asamura | .............. H03B 5/1847 331/107 DP |

(Continued)

FOREIGN PATENT DOCUMENTS

| EP | 0527470 A1 * | 2/1993 | ........... H03B 5/1847 |
| EP | 1209756 A1 * | 5/2002 | ................ H01P 5/16 |

(Continued)

OTHER PUBLICATIONS

Korean Office Action for corresponding Korean Patent Application No. 10-2014-0112177 dated Jan. 13, 2016.
(Continued)

*Primary Examiner* — Ryan Johnson
(74) *Attorney, Agent, or Firm* — Hauptman Ham, LLP (57) ABSTRACT

The apparatus comprises a first coupler configured to receive two output signals, having 180° phase difference, outputted from a first differential generator as two input signals, and output a first voltage signal generated by adding the two input signals and a second voltage signal corresponding to subtraction of the two input signals, a second coupler configured to receive two output signals, having 180° phase difference, outputted from a second differential generator as two input signals, and output a third voltage signal generated by adding the two input signals and a fourth voltage signal corresponding to subtraction of the two input signals, a coupling network connected to the first differential generator and the second differential generator and a third coupler configured to output a signal generated by adding the voltage signal outputted from the first coupler and corresponding voltage signal outputted from the second coupler.

5 Claims, 6 Drawing Sheets

(52) U.S. Cl.
CPC ... *H03B 5/1231* (2013.01); *H03B 2200/0076* (2013.01); *H03B 2200/0084* (2013.01); *H03D 2200/0003* (2013.01); *H03D 2200/0005* (2013.01)

(56) References Cited

U.S. PATENT DOCUMENTS

| | | |
|---|---|---|
| 2011/0037502 A1 | 2/2011 | Nakano et al. |
| 2013/0082785 A1* | 4/2013 | Afshari ................ H03B 28/00 331/48 |

FOREIGN PATENT DOCUMENTS

| | | |
|---|---|---|
| JP | 11-330861 A | 11/1999 |
| JP | 2003-249853 A | 9/2003 |
| KR | 10-2007-0020596 A | 2/2007 |
| KR | 10-0756031 B1 | 9/2007 |
| KR | 10-2011-0068093 A | 6/2011 |

OTHER PUBLICATIONS

Korean Notice of Allowance for corresponding Korean Patent Application No. 10-2014-0112177 dated Jun. 30, 2016.
International Search Report dated May 27, 2015 for PCT/KR2014/013122.

* cited by examiner

HIGH FREQUENCY SIGNAL GENERATION APPARATUS

CROSS REFERENCE TO RELATED APPLICATION

This application claims the priority of Korean Patent Application No. 10-2014-0112177, filed Aug. 27, 2014 in the Korean Intellectual Property Office. Further, this application is the National Phase application of International Application No. PCT/KR2014/013122 filed Dec. 31, 2014, which designates the United States and was published in Korean.

BACKGROUND

1. Field of the Invention

The present disclosure relates to an apparatus for generating a high frequency signal, and more particularly relates to an apparatus for generating a high power signal with reducing size of the apparatus.

2. Description of the Related Art

A very high frequency band, for example THz, in the limelight in recent has been required in various application fields such as an imaging or a wideband communication. Importance of a THz system has increased.

It is possible to achieve the THz system driven with small size, low cost and low power due to enhancement of performance of a semiconductor device. Additionally, it is difficult to manufacture the THz system in on-chip because a passive circuit such as a coupler has very great size, in a lower frequency band. However, the THz system can be realized in on-chip in a high frequency band because the passive circuit has small size according as a frequency gets higher.

Highest issue in a THz band is to manufacture a high power signal source. The higher an output power of a generated signal gets, the better a signal to noise SNR at a receiver side can be obtained. Hence, a high resolution system can be achieved. However, it is difficult to produce a generator for operating in the high frequency band. Accordingly, technologies capable of improving a performance such as an operation frequency, an output power, a phase noise, etc. of the generator have been actively studied.

It is difficult to produce the generator for operating in the high frequency band, but it is more difficult to obtain high output power. Since it is difficult to manufacture an amplifier, it is limited to increase the output power by using a power amplifier used in the low frequency band. Even if the power amplifier for generating a high power might be manufactured, energy efficiency is low because the power amplifier consumes very high DC power.

The Korean laid open patent No. 10-2014-0058742 (title: a wideband add-drop circuit for a microwave integrated circuit) discloses a technique for receiving two high frequency signals which have 180° phase difference and overlapping and cancelling the received high frequency signals. However, the patent does not disclose a technique for generating a signal having higher output power than the overlapped signal. Furthermore, the patent does not provide a technique for minimizing a size of an apparatus for generating a high frequency signal.

SUMMARY

The invention has been made to address at least the disadvantages and problems described above, and to provide at least the advantages described below. An aspect of the invention provides an apparatus for generating a high frequency signal capable of generating a signal having high output power with reducing a size of the apparatus.

Other features of the invention may be obtained by a person in an art of the invention through following embodiments.

According to one embodiment of the invention, an apparatus for generating a high frequency signal comprises a first coupler configured to receive two output signals, having 180° phase difference, outputted from a first differential generator as two input signals, and output a first voltage signal generated by adding the two input signals and a second voltage signal corresponding to subtraction of the two input signals; a second coupler configured to receive two output signals, having 180° phase difference, outputted from a second differential generator as two input signals, and output a third voltage signal generated by adding the two input signals and a fourth voltage signal corresponding to subtraction of the two input signals; a coupling network connected to the first differential generator and the second differential generator so that the first differential generator and the second differential generator are in phase; and a third coupler configured to output a signal generated by adding the voltage signal outputted from the first coupler and corresponding voltage signal outputted from the second coupler.

The first differential generator and the second differential generator have a common base cross-coupled structure.

The first coupler and the second coupler are rat-race couplers having a circular line.

The third coupler is a Wilkinson coupler.

The first voltage signal and the third voltage signal are cancelled by adding corresponding input signals having 180° phase difference, and the second voltage signal and the fourth voltage signal have a power higher than a power of the input signal.

An apparatus for generating a high frequency signal of the invention employs two couplers including a differential generator and a coupler for amplifying a power by adding signals outputted from the two couplers, thereby generating the high frequency signal with high output power with reducing an area of the apparatus.

The apparatus for generating the high frequency signal may produce high output power by using only two generators without using a power amplifier.

The apparatus of the invention may be used in a frequency band where it is impossible to manufacture an amplifier. In addition, a size of the coupler considerably reduces in a high frequency band such as THz, and thus the coupler may be manufactured in on-chip.

Moreover, two rate-race couplers include respectively the generator and a Wilkinson coupler adds outputs of the two rat-rate couplers, and thus an output power may increase by total four times.

BRIEF DESCRIPTION OF DRAWINGS

The aspects, features, advantages and embodiments of the invention will be more apparent from the following detailed description taken in conjunction with reference to the accompanying drawings, in which.

DETAILED DESCRIPTION

Example embodiments of the present invention are disclosed herein. However, specific structural and functional details disclosed herein are merely representative for purposes of describing example embodiments of the present invention, however, example embodiments of the present invention may be embodied in many alternate forms and should not be construed as limited to example embodiments of the present invention set forth herein.

Hereinafter, embodiments of the invention will be described in detail with reference to accompanying drawings. Like numbers refer to like elements throughout the description of the figures.

Figure 1:
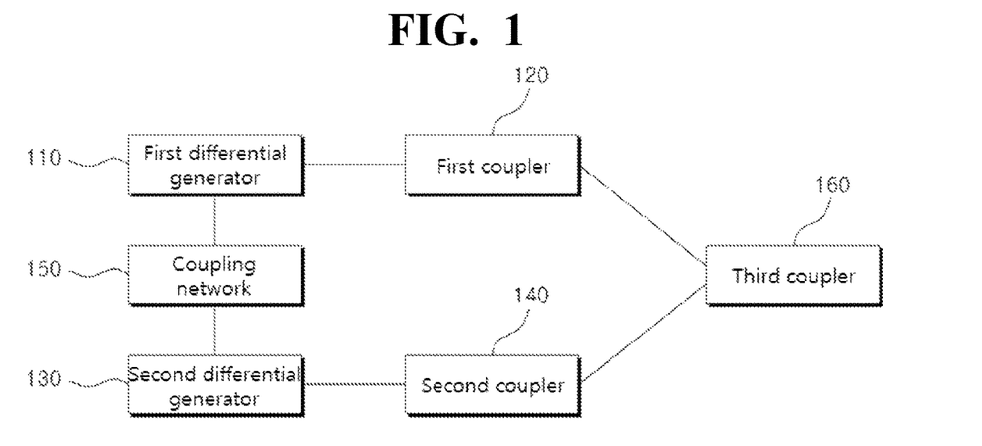
FIG. 1 is a block diagram illustrating an apparatus for generating a high frequency signal according to one embodiment of the invention.

FIG. 1 is a block diagram illustrating an apparatus for generating a high frequency signal according to one embodiment of the invention.

In FIG. 1, the apparatus 100 for generating the high frequency signal of the present embodiment may include a first differential generator 110, a first coupler 120, a second differential generator 130, a second coupler 140, a coupling network 150 and a third coupler 160.

In one embodiment, the first coupler 120 may be a rat-race coupler having a circular line. Here, the first differential generator 110 locates in a circle of the circular line.

The second coupler 130 may also be a rat-race coupler having a circular structure. Here, the second differential generator 140 locates in the circular structure.

Structure of the first differential generator 110, the second differential generator 130, the first coupler 120 and the second coupler 140 will be described in detail with reference to accompanying drawing FIG. 2.

In one embodiment, the first differential generator 110 outputs two signals which have 180° phase difference.

The first coupler 120 receives two outputs of the first differential generator 110 as input signals, and outputs a first voltage signal generated by adding the two outputs and a second voltage signal corresponding to subtraction of the two outputs.

The second coupler 140 receives also two outputs of the second differential generator 130 as input signals, and outputs a third voltage signal generated by adding the two outputs and a fourth voltage signal corresponding to subtraction of the two outputs.

In one embodiment, the first differential generator 110 and the second differential generator 130 are in phase via the coupling network 150, and thus the first voltage signal of the first coupler 120 and the third voltage signal of the second coupler 140 are in phase, and the second voltage signal of the first coupler 120 and the fourth voltage signal of the second coupler 140 are in phase.

An output terminal of the first coupler 120 and an output terminal of the second coupler are connected to the third coupler 160, and the third coupler 160 outputs a high frequency signal having a power higher by four times than a power of an original signal, by adding the first voltage signal, the second voltage signal, the third voltage signal and the fourth voltage signal.

Amplification of the output power by four times will be described in detail with reference to accompanying drawings FIG. 2 to FIG. 3.

Figure 2:
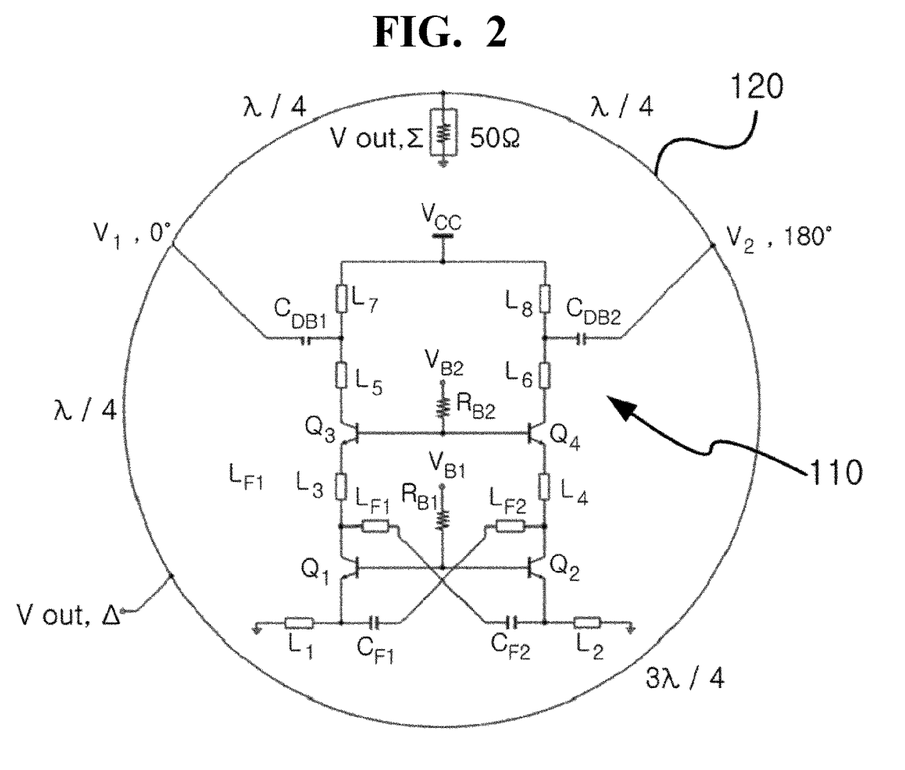
FIG. 2 is a view illustrating a first differential generator and a first coupler according to one embodiment of the invention.

FIG. 2 is a view illustrating a first differential generator and a first coupler according to one embodiment of the invention.

In FIG. 2, the first coupler 120 may have a rat-race structure with a circular line, and the first differential generator 110 locates in the first coupler 120.

The first differential generator 110 may have a common base cross-coupled structure, but it is not limited. However, many modifications of the first differential generator 110 are possible as long as the first differential generator 110 has differential output, and they are within the scope and the spirit of the invention.

An area of the apparatus for generating the high frequency signal is minimized because the first differential generator 110 locates in the first coupler 120, and so it is possible to manufacture the apparatus in on-chip.

The first coupler 120 includes two input terminals $V_1$ and $V_2$ and two output terminals $V_{out.\Sigma}$ and $V_{out.\Delta}$. Two signals, having 180° phase difference, outputted from the first differential generator 110 are inputted to the two input terminals of the first coupler 120.

In FIG. 2, a first output terminal $V_{out.\Sigma}$ outputs the first voltage signal generated by adding two signals outputted from the first differential generator 110. A second output terminal $V_{out.\Delta}$ outputs the second voltage signal corresponding to subtraction of two signals outputted from the first differential generator 110.

As described above, since the two signals outputted from the first differential generator 110 have 180° phase difference, a power at the first output terminal is cancelled, and the second voltage signal, having a power by two times according to the adding of the signals, is outputted from the second output terminal.

The operation of the first differential generator 110 and the first coupler 120 is described with reference to FIG. 2, but the second differential generator 130 and the second coupler 140 have the same structure as the first differential generator 110 and the first coupler 120, respectively. Operation of the second differential generator 130 and the second coupler 140 is identical to that of the first differential generator 110 and the second coupler 120.

The second coupler 140 outputs the third voltage signal generated by adding two signals outputted from the second differential generator 130 and the fourth voltage signal corresponding to subtraction of the two signals.

Here, the third voltage signal corresponds to a cancelled signal, and the fourth voltage signal has a power higher by two times than a power of the signal outputted from the second differential generator 130.

Figure 3:
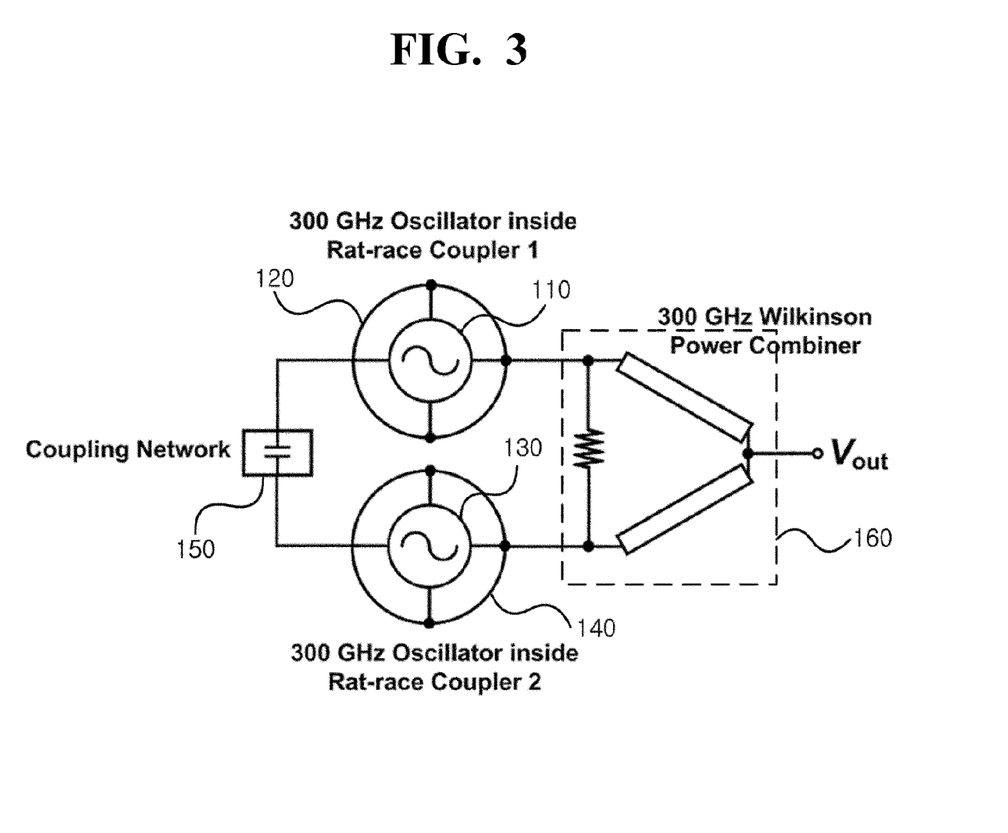
FIG. 3 is a view illustrating a process of amplifying a power at the third coupler according to one embodiment of the invention.

FIG. 3 is a view illustrating a process of amplifying a power at the third coupler according to one embodiment of the invention.

In FIG. 3, the first differential generator 110 and the second differential generator 130 are connected to the coupling network 150. The coupling network 150 adjusts the first differential generator 110 and the second differential generator 130 in phase.

In one embodiment, the third coupler 160 may be a Wilkinson coupler. The third coupler 160 outputs a signal generated by adding the voltage signal outputted from the first coupler 120 and the voltage signal outputted from the second coupler 140.

As described above, the second voltage signal and the fourth voltage signal of the first voltage signal to the fourth voltage signal have the power higher by two times than the power of the signals outputted from the differential generators 110 and 130, respectively. The third coupler 160 adds the second voltage signal and the fourth voltage signal, thereby outputting the signal having a power higher by four times than a power of the signal outputted from the differential generator.

As described above, unlike the first coupler 120 and the second coupler 140, the third coupler 160 receives two signals having 0° phase difference and adds the received two signals.

Figure 4:
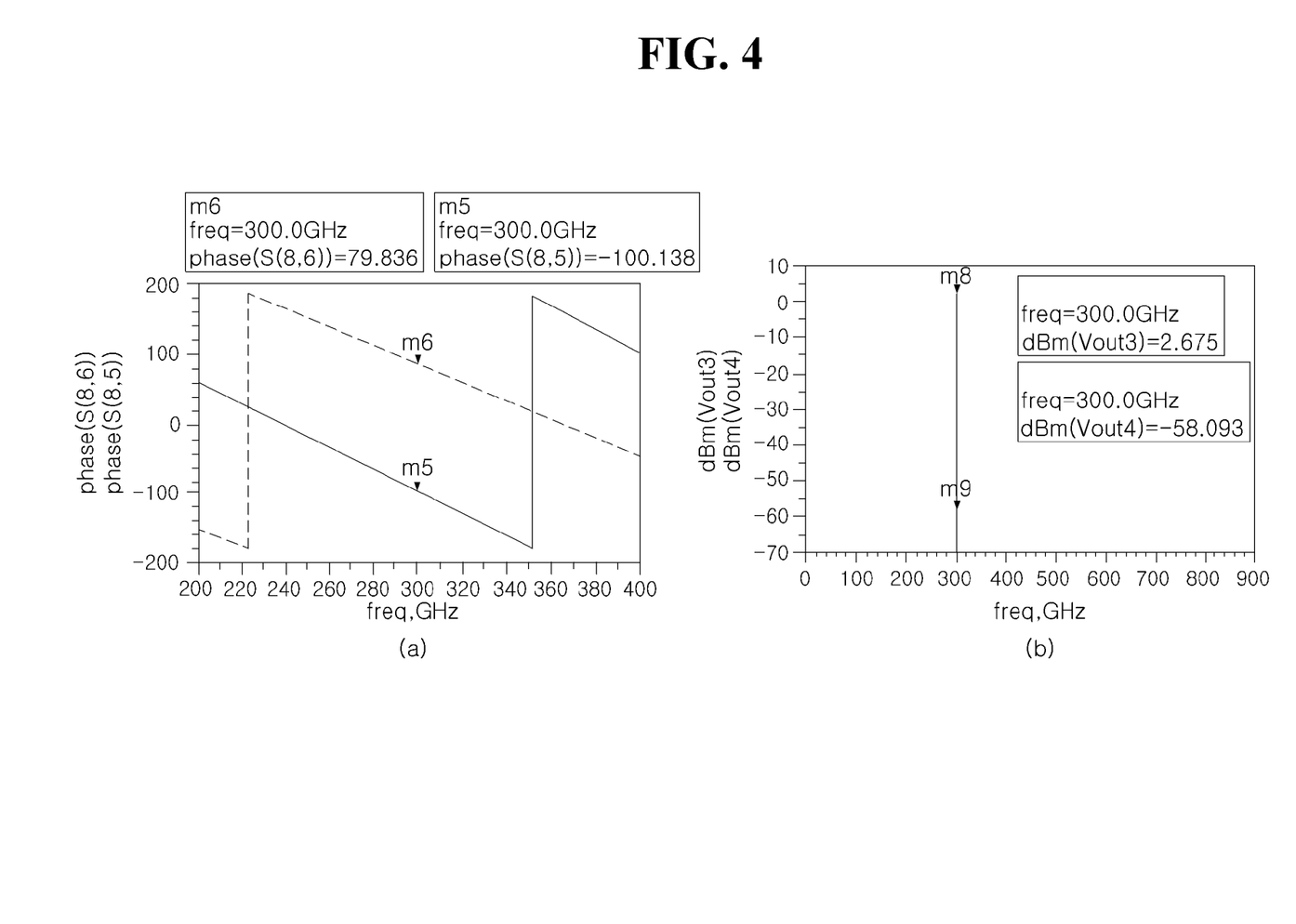
FIG. 4 is a view illustrating a simulation result of the rat-race coupler according to one embodiment of the invention.

FIG. 4 is a view illustrating a simulation result of the rat-race coupler according to one embodiment of the invention.

It is verified through (a) of FIG. 4 that two inputs has 180° phase difference at approximate 300 GHz. It is verified through (b) of FIG. 4 that output powers are added when a power of an input signal is 0 dBm, and thus the power at the second output terminal $V_{out.\Delta}$ increases to 2.7 dBm. It is verified through (b) of FIG. 4 that the signals are cancelled when the power of the input signal is 0 dBm, and so the power at the first output terminal $V_{out.\Sigma}$ decreases to −58 dBm.

The output power should increase ideally by 3 dB, but it increases by 2.7 dB because power loss of the rat-race coupler is 0.3 dB.

Figure 5:
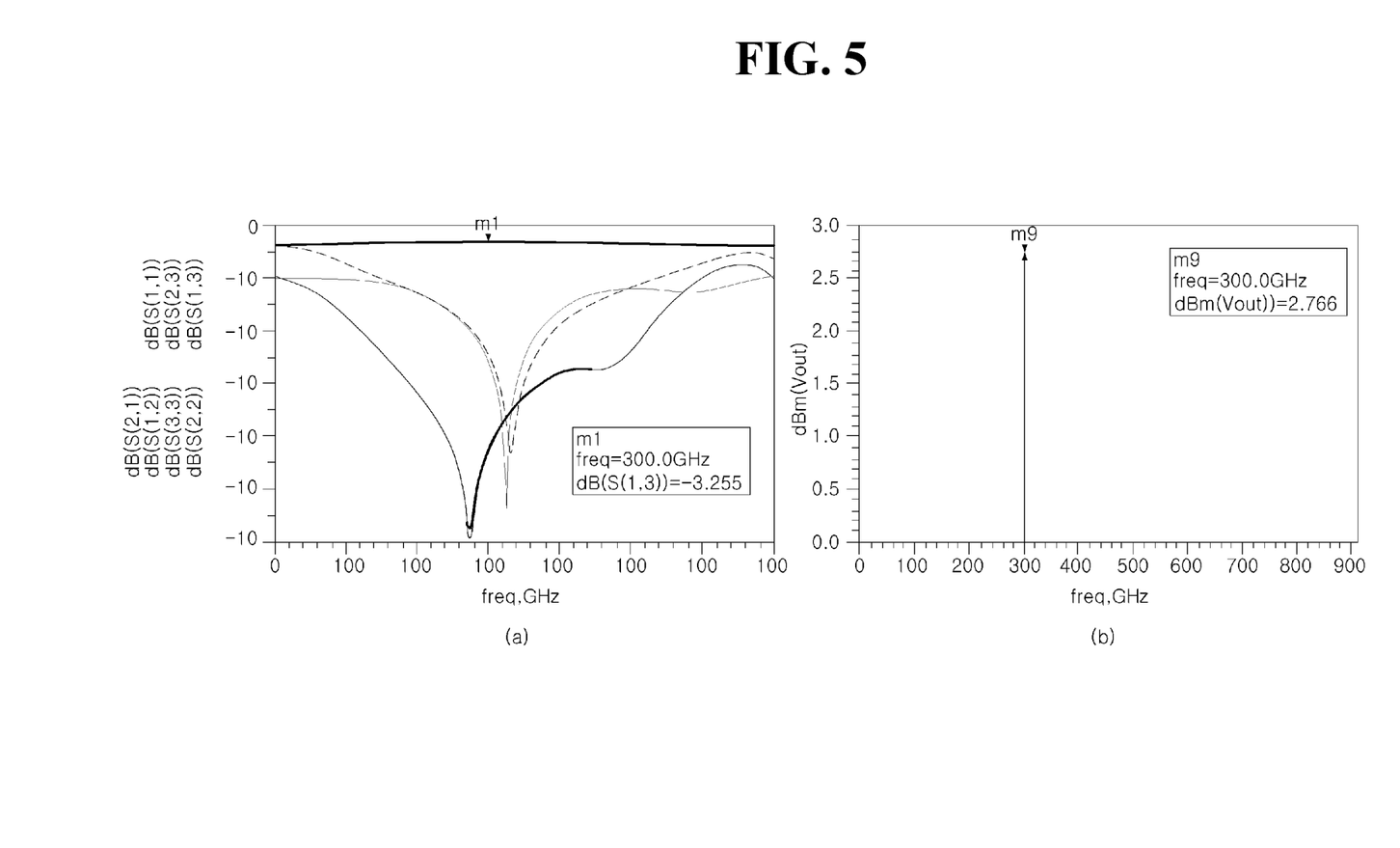
FIG. 5 illustrates simulation result of the Wilkinson coupler according to one embodiment of the invention.

FIG. 5 illustrates simulation result of the Wilkinson coupler according to one embodiment of the invention. (a) of FIG. 5 shows a result of S-parameter of the coupler. It is verified that the coupler has loss of about 0.2 dB at approximate 300 GHz, reflection of each of the input terminals and the output terminal is small, and isolation of the input terminals and the output terminal is excellent. It is verified through (b) of FIG. 5 that powers are added when the power of the input signal is 0 dBm, and thus the power at the output terminal increases to 2.8 dBm.

Figure 6:
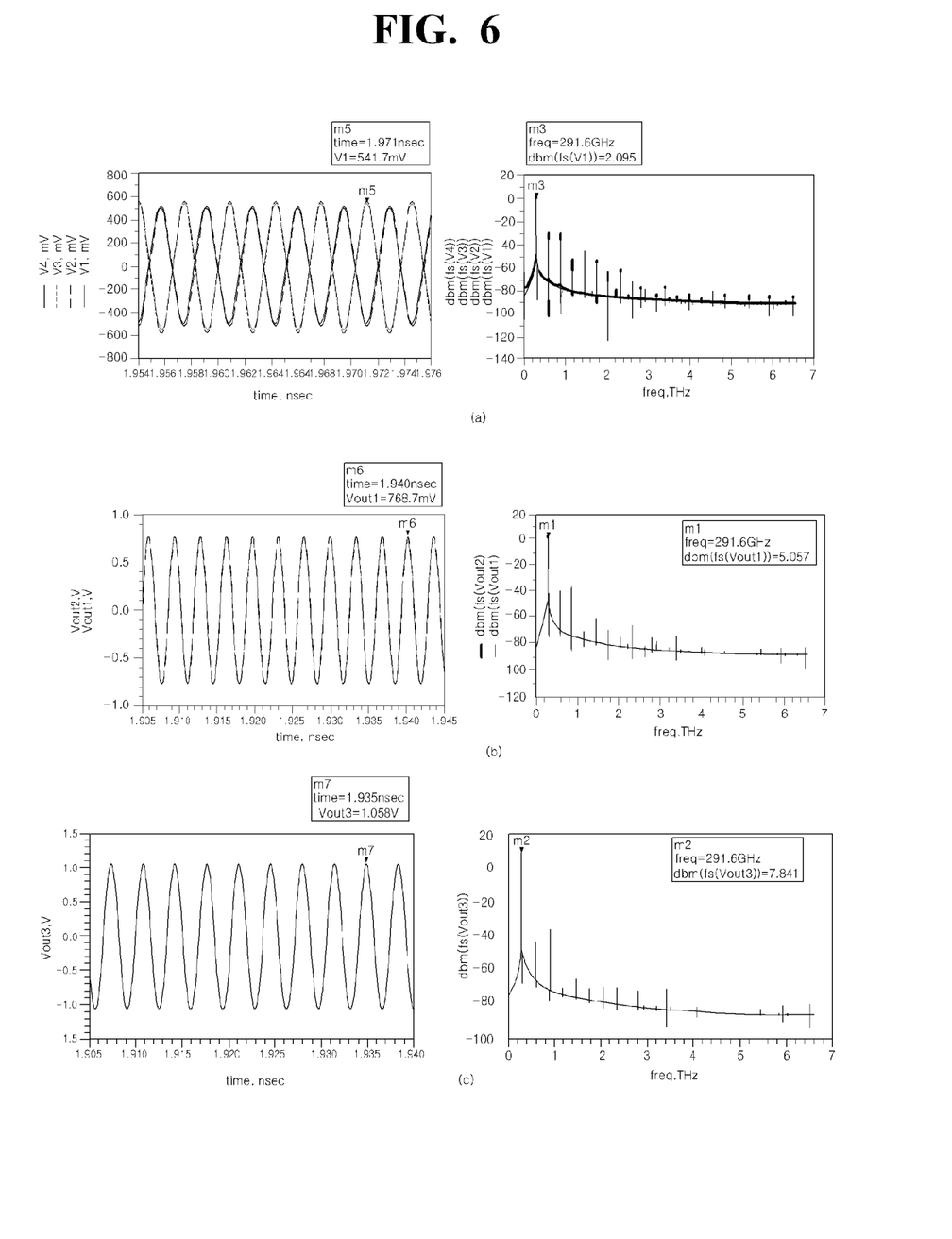
FIG. 6 is a view illustrating a simulation result of the apparatus for generating the high frequency signal which the differential generators are integrated.

FIG. 6 is a view illustrating a simulation result of the apparatus for generating the high frequency signal which the differential generators are integrated.

(a) of FIG. 6 illustrates output power and oscillation frequency of single differential generator, (b) of FIG. 6 shows the output power increased by two times at the rat-race coupler, and (c) of FIG. 6 illustrates the output power increased by four times at the Wilkinson coupler.

The differential generator generates a signal in 291.6 GHz, and has an output power of 4.8 dBm.

The output power increases to 7.7 dBm according as an output signal of the differential generator is inputted to the rat-race coupler, and it increases to 10.5 dBm according as the signals outputted from two rat-race couplers including the differential generator are inputted to the Wilkinson coupler. That is, it is verified that the output power increases by total 5.7 dB (approximate four times).

The embodiments of the invention described above are disclosed only for illustrative purposes. A person having ordinary skill in the art would be able to make various modifications, alterations, and additions without departing from the spirit and scope of the invention, but it is to be appreciated that such modifications, alterations, and additions are encompassed by the scope of claims set forth below.

What is claimed is:

1. An apparatus for generating a high frequency signal comprising:
    a first coupler configured to receive two output signals, having 180° phase difference, outputted from a first differential generator as two input signals, and output a first voltage signal generated by adding the two input signals and a second voltage signal corresponding to subtraction of the two input signals;
    a second coupler configured to receive two output signals, having 180° phase difference, outputted from a second differential generator as two input signals, and output a third voltage signal generated by adding the two input signals and a fourth voltage signal corresponding to subtraction of the two input signals;
    a coupling network connected to the first differential generator and the second differential generator so that the first differential generator and the second differential generator are in phase; and
    a third coupler configured to output a signal generated by adding the second voltage signal and the fourth voltage signal.

2. The apparatus of claim 1, wherein the first differential generator and the second differential generator have a common base cross-coupled structure.

3. The apparatus of claim 1, wherein the first coupler and the second coupler are rat-race couplers having a circular line.

4. The apparatus of claim 1, wherein the third coupler is a Wilkinson coupler.

5. The apparatus of claim 1, wherein
    the first voltage signal and the third voltage signal are cancelled by adding corresponding input signals having 180° phase difference, respectively, and
    the third coupler is configured to output the generated signal having a power increased by adding the second voltage signal and the fourth voltage signal.

* * * * *